(12) United States Patent
Chang et al.

(10) Patent No.: US 11,546,994 B2
(45) Date of Patent: Jan. 3, 2023

(54) VOLTAGE REGULATOR MODULE

(71) Applicant: Delta Electronics, Inc., Taoyuan (TW)

(72) Inventors: Xueliang Chang, Taoyuan (TW); Shengli Lu, Taoyuan (TW); Mingyun Yang, Taoyuan (TW); Qinghua Su, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/072,427

(22) Filed: Oct. 16, 2020

(65) Prior Publication Data

US 2021/0127491 A1    Apr. 29, 2021

(30) Foreign Application Priority Data

Oct. 28, 2019   (CN) .......................... 201911033292.8

(51) Int. Cl.
| | |
|---|---|
| *H05K 1/18* | (2006.01) |
| *H05K 3/18* | (2006.01) |
| *H01F 3/00* | (2006.01) |

(52) U.S. Cl.
CPC .............. *H05K 1/181* (2013.01); *H01F 3/00* (2013.01); *H05K 3/188* (2013.01); *H05K 2201/10166* (2013.01); *H05K 2203/0723* (2013.01)

(58) Field of Classification Search
CPC ... H05K 1/11; H05K 1/14; H05K 1/18; H05K 1/181; H05K 5/02; H05K 5/06; H05K 2201/086; H01F 17/04; H01F 17/043; H01F 27/02; H01F 27/24; H01F 27/28–29

USPC ........................... 361/775–784; 363/199–200
See application file for complete search history.

(56) References Cited

U.S. PATENT DOCUMENTS

| | | | |
|---|---|---|---|
| 8,094,458 | B2 | 1/2012 | Furnival |
| 8,427,269 | B1 | 4/2013 | Vinciarelli et al. |
| 8,966,747 | B2 | 3/2015 | Vinciarelli et al. |
| 9,387,633 | B1 | 7/2016 | Vinciarelli et al. |

(Continued)

FOREIGN PATENT DOCUMENTS

| | | |
|---|---|---|
| CN | 1378415 A | 11/2002 |
| CN | 2629393 Y | 7/2004 |

(Continued)

*Primary Examiner* — Tuan T Dinh
(74) *Attorney, Agent, or Firm* — Kirton McConkie; Evan R. Witt

(57) ABSTRACT

A voltage regulator module with a vertical layout structure includes a circuit board assembly, an electroplated region and a magnetic core assembly. The circuit board assembly includes a printed circuit board and at least one switch element. The printed circuit board includes a first surface, a second surface, a plurality of lateral surfaces, an accommodation space and a conductive structure. The switch element is disposed on the first surface. A conduction part is formed on the second surface. The conductive structure is perpendicular to the printed circuit board and disposed within the accommodation space. The electroplated region is formed on the corresponding lateral surface, arranged between the conduction part and the first surface, and electrically connected with the conduction part and the switch element. The magnetic core assembly is accommodated within the accommodation space. Consequently, an inductor is defined by the conductive structure and the magnetic core assembly collaboratively.

17 Claims, 8 Drawing Sheets

(56) References Cited

U.S. PATENT DOCUMENTS

| | | | |
|---|---|---|---|
| 9,516,761 B2 | 12/2016 | Vinciarelli et al. | |
| 9,936,580 B1 | 4/2018 | Vinciarelli et al. | |
| 10,264,664 B1 | 4/2019 | Vinciarelli et al. | |
| 2006/0197510 A1 | 9/2006 | Chandrasekaran | |
| 2010/0013587 A1 | 1/2010 | Yan et al. | |
| 2011/0273257 A1* | 11/2011 | Ishizawa | H01F 17/043 336/192 |
| 2014/0313003 A1* | 10/2014 | Liu | H01F 27/2847 336/178 |
| 2015/0062989 A1* | 3/2015 | Su | H05K 1/0373 361/748 |
| 2015/0282370 A1* | 10/2015 | Yang | H01F 5/00 361/736 |
| 2015/0302974 A1* | 10/2015 | Zhao | H01F 41/046 336/200 |
| 2016/0049235 A1* | 2/2016 | Parish | H01F 27/2804 29/605 |
| 2016/0049236 A1* | 2/2016 | Kn | H01F 27/2895 29/605 |
| 2016/0268034 A1 | 9/2016 | Subat et al. | |
| 2016/0302312 A1 | 10/2016 | Vinciarelli et al. | |
| 2017/0104419 A1 | 4/2017 | Zeng et al. | |
| 2018/0122562 A1* | 5/2018 | Ji | H05K 1/185 |
| 2019/0311839 A1 | 10/2019 | Rump et al. | |
| 2020/0173013 A1 | 6/2020 | Nguyen et al. | |
| 2020/0304036 A1 | 9/2020 | Xiong et al. | |

FOREIGN PATENT DOCUMENTS

| | | |
|---|---|---|
| CN | 101996759 A | 3/2011 |
| CN | 201936720 U | 8/2011 |
| CN | 102360787 A | 2/2012 |
| CN | 103475226 A | 12/2013 |
| CN | 103956250 A | 7/2014 |
| CN | 106533179 A | 3/2017 |
| CN | 107437885 A | 12/2017 |
| CN | 108022917 A | 5/2018 |
| CN | 110139477 A | 8/2019 |
| CN | 209448994 U | 9/2019 |
| GB | 2471497 | 1/2011 |
| JP | 2009177019 A | 8/2009 |
| WO | 2014206460 A1 | 12/2014 |

* cited by examiner

VOLTAGE REGULATOR MODULE

FIELD OF THE INVENTION

The present disclosure relates to a voltage regulator module, and more particularly to a voltage regulator module with reduced volume.

BACKGROUND OF THE INVENTION

Please refer to FIGS. 1A and 1B. FIG. 1A schematically illustrates the structure of a conventional electronic device. FIG. 1B schematically illustrates the structure of a voltage regulator module of the electronic device as shown in FIG. 1A. As shown in FIGS. 1A and 1B, the electronic device 1 has a horizontal layout structure. The electronic device 1 includes a central processing unit (CPU) 11, a voltage regulator module 12, a system board 13 and an output capacitor 14. The voltage regulator module 12 is used for converting an input voltage into a regulated voltage and providing the regulated voltage to the central processing unit 11. The voltage regulator module 12 and the central processing unit 11 are disposed on a first surface of the system board 13. For meeting the load dynamic switching requirements, the output terminal of the voltage regulator module 12 is located near the input terminal of the central processing unit 11. The output capacitor 14 is disposed on a second surface of the system board 13. The output capacitor 14 is located beside the input terminal of the central processing unit 11.

The voltage regulator module 12 further includes a printed circuit board 15 and a magnetic element 16. The magnetic element 16 is disposed on the printed circuit board 15. Moreover, a switch element is disposed in a vacant space between the printed circuit board 15 and the magnetic element 16. The printed circuit board 15 is disposed on the first surface of the system board 13. The heat from the voltage regulator module 12 can be transferred to the system board 13 through the printed circuit board 15. Moreover, the heat is dissipated away through a heat dissipation mechanism (not shown) of the system board 13.

Recently, the required current for the central processing unit 11 is gradually increased. In addition, the trend of the volume of the electronic device is toward miniaturization. Since the central processing unit 11 and the voltage regulator module 12 are located at the same side of the system board 13, the electronic device cannot meet the load dynamic switching requirements.

For reducing the volume of the electronic device and effectively enhancing the dynamic switching performance of the voltage regulator module, another electronic device is disclosed. FIG. 2 schematically illustrates the structure of another conventional electronic device. The electronic device 1' of FIG. 2 has the vertical layout structure. The voltage regulator module 12 is disposed on the second surface of the system board 13, so that the voltage regulator module 12 and the central processing unit 11 are disposed on opposed surfaces of the system board 13. Consequently, the volume of the electronic device 1' is effectively reduced. Moreover, since the output capacitor 14 is located near the output terminal of the voltage regulator module 12 and the input terminal of the central processing unit 11, the dynamic switching performance of the voltage regulator module 12 is enhanced.

Although the dynamic switching performance of the voltage regulator module 12 of the electronic device 1' as shown in FIG. 2 is enhanced, there are still some drawbacks. For example, since the magnetic element 16 and the switch element of the voltage regulator module 12 are disposed on the same side of the printed circuit board 15 and the switch element is disposed in the vacant space between the printed circuit board 15 and the magnetic element 16, it is difficult to optimize the structure and the size of the magnetic element 16 of the voltage regulator module 12.

Moreover, the input terminal and the output terminal of the voltage regulator module 12 of the electronic device 1' are made of copper blocks. Generally, the volume of the copper block is bulky. In other words, the size of the voltage regulator module 12 in the electronic device 1' is still large. Moreover, when the voltage regulator module 12 on the system board 13 undergoes a reflow soldering process, the inner components to be reheated are possibly detached or shifted.

Therefore, there is a need of providing an improved voltage regulator module in order to overcome the drawbacks of the conventional technologies.

SUMMARY OF THE INVENTION

An object of the present disclosure provides a voltage regulator module with reduced size.

In accordance with an aspect of the present disclosure, a voltage regulator module is provided. The voltage regulator module includes a circuit board assembly, at least one electroplated region and a magnetic core assembly. The circuit board assembly includes a printed circuit board and at least one switch element. The printed circuit board has a first surface, a second surface, a plurality of lateral surfaces, an accommodation space and at least one conductive structure. The first surface and the second surface are opposed to each other. The plurality of lateral surfaces are circumferentially arranged between the first surface and the second surface. The accommodation space is defined by the first surface, the second surface and the plurality of lateral surfaces collaboratively. The at least one conductive structure is perpendicular to the printed circuit board and disposed within the accommodation space. The at least one switch element is disposed on the first surface. Moreover, at least one conduction part is formed on the second surface. The at least one electroplated region is formed on the corresponding lateral surface, and includes at least one first electroplated part. The first electroplated part is arranged between the corresponding conduction part and the first surface, and electrically connected with the corresponding conduction part and the at least one switch element. The magnetic core assembly is accommodated within the accommodation space, and includes at least one opening. The at least one conductive structure is penetrated through the corresponding opening. Consequently, at least one inductor is defined by the at least one conductive structure and the magnetic core assembly collaboratively.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
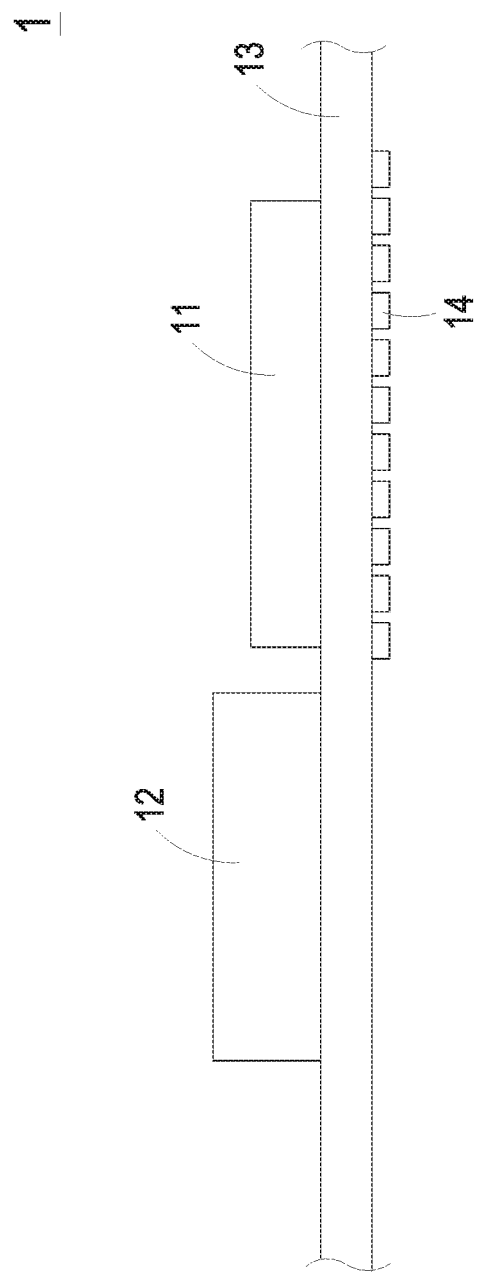
FIG. 1A schematically illustrates the structure of a conventional electronic device.
Figure 1B:
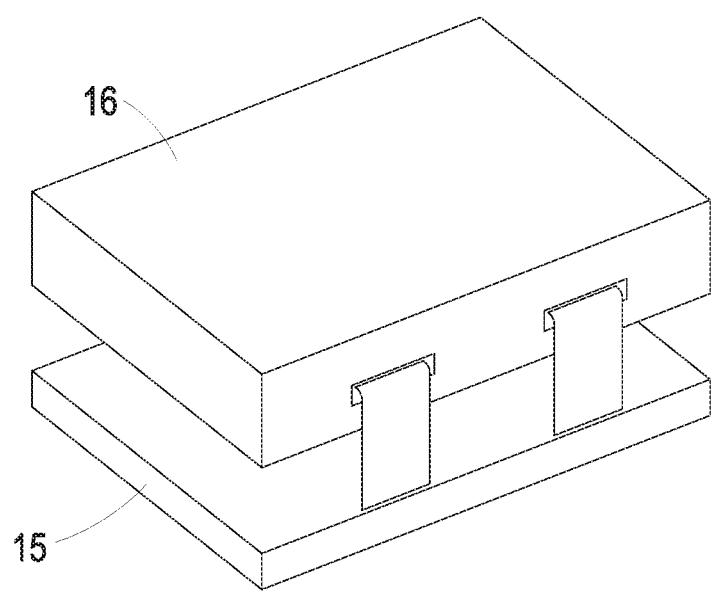
FIG. 1B schematically illustrates the structure of a voltage regulator module of the electronic device as shown in FIG. 1A.
Figure 2:
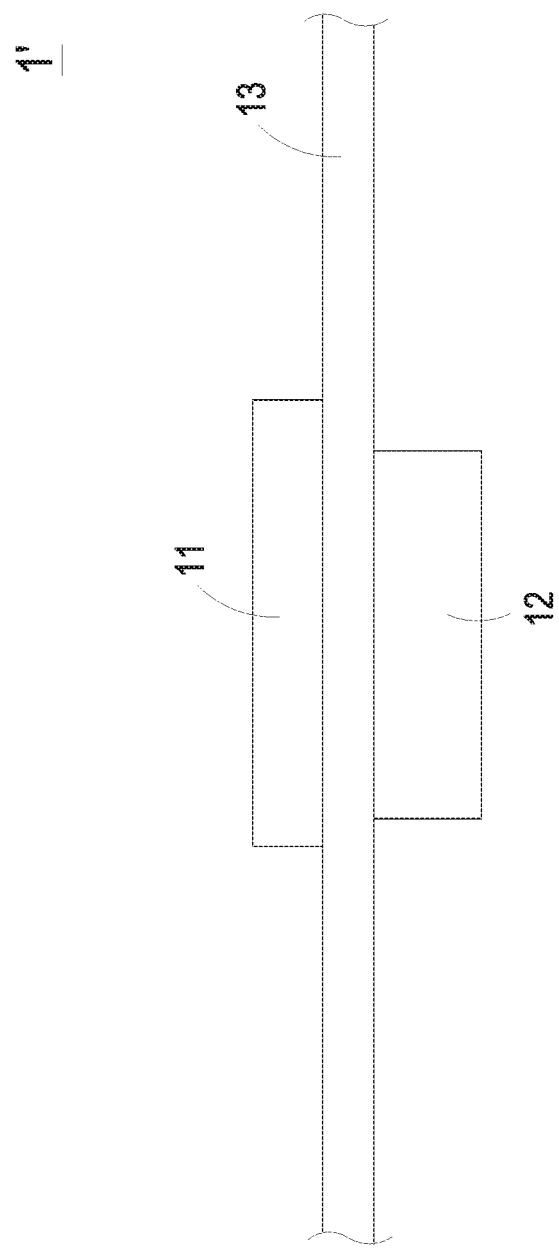
FIG. 2 schematically illustrates the structure of another conventional electronic device.
Figure 3:
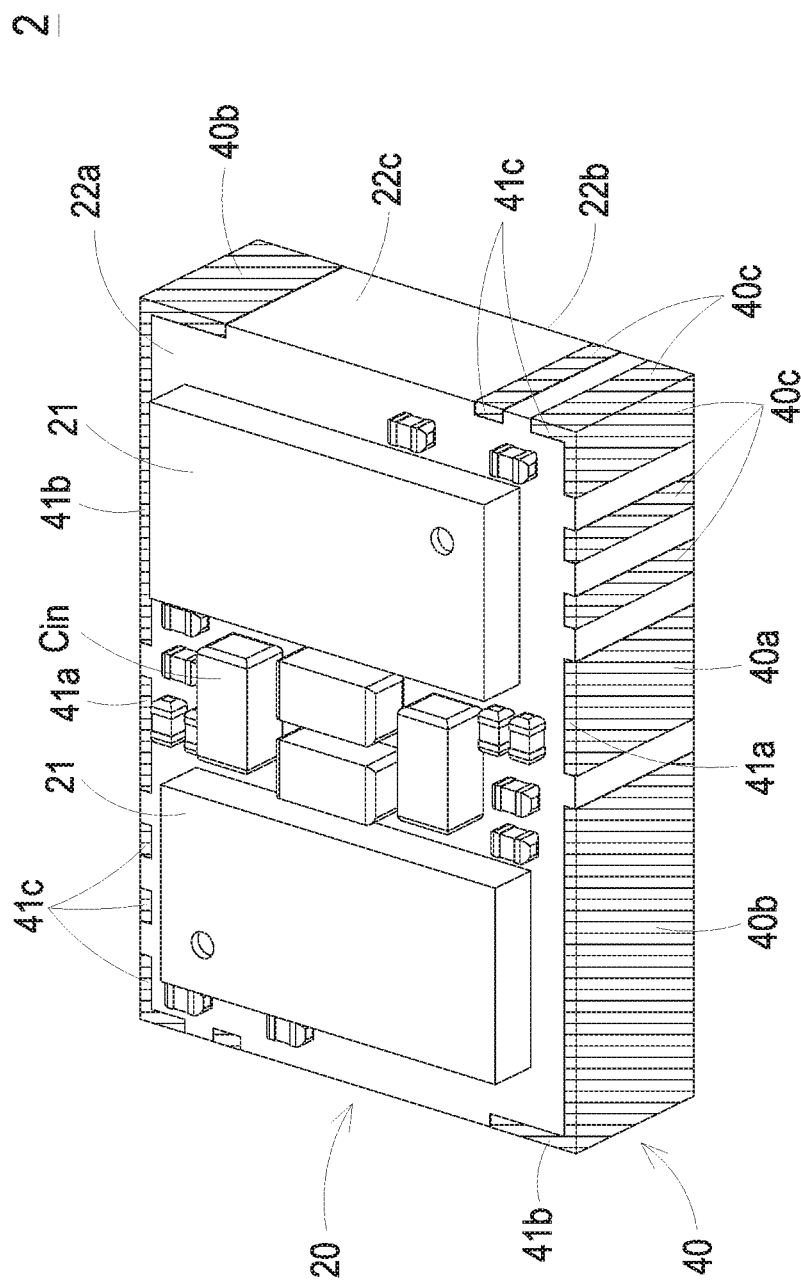
FIG. 3 is a schematic perspective view illustrating a voltage regulator module according to a first embodiment of the present disclosure and taken along a viewpoint.
Figure 4:
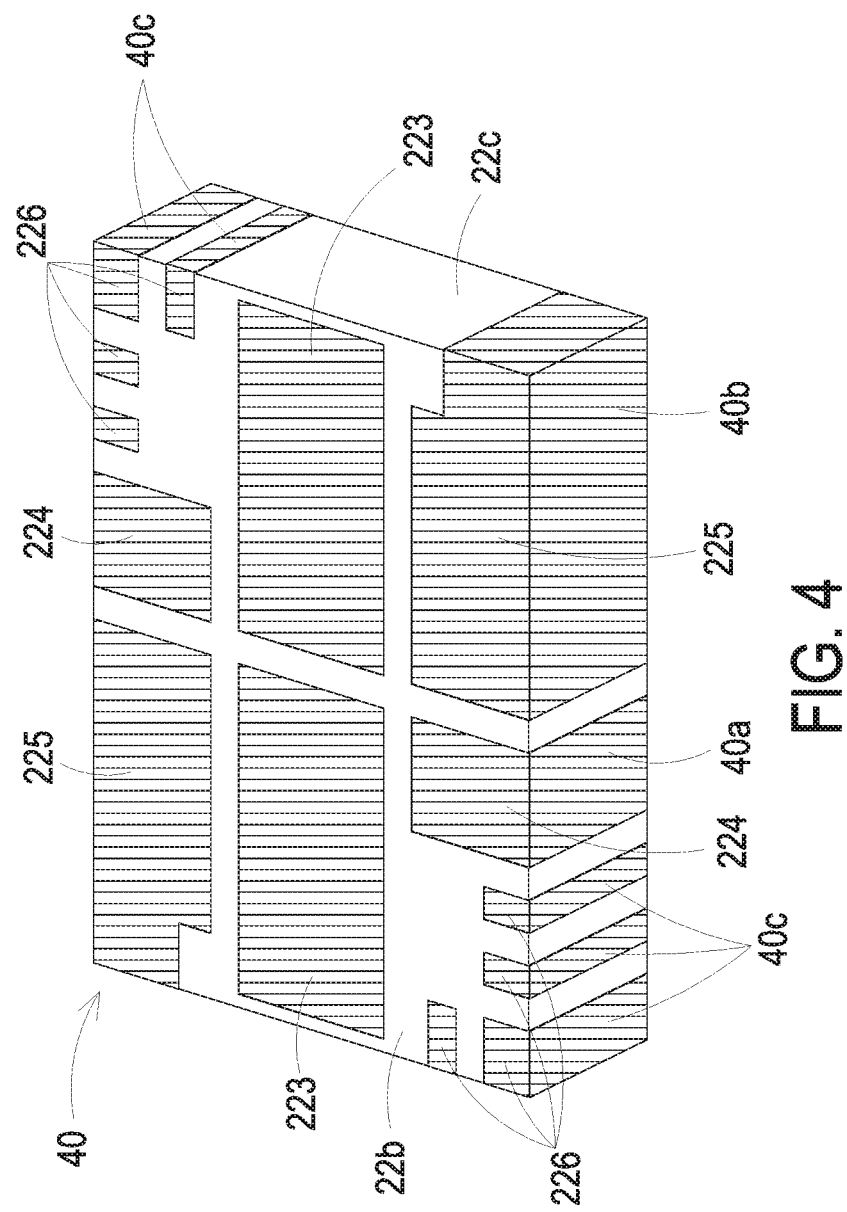
FIG. 4 is a schematic perspective view illustrating the voltage regulator module of FIG. 3 and taken along another viewpoint.
Figure 5:
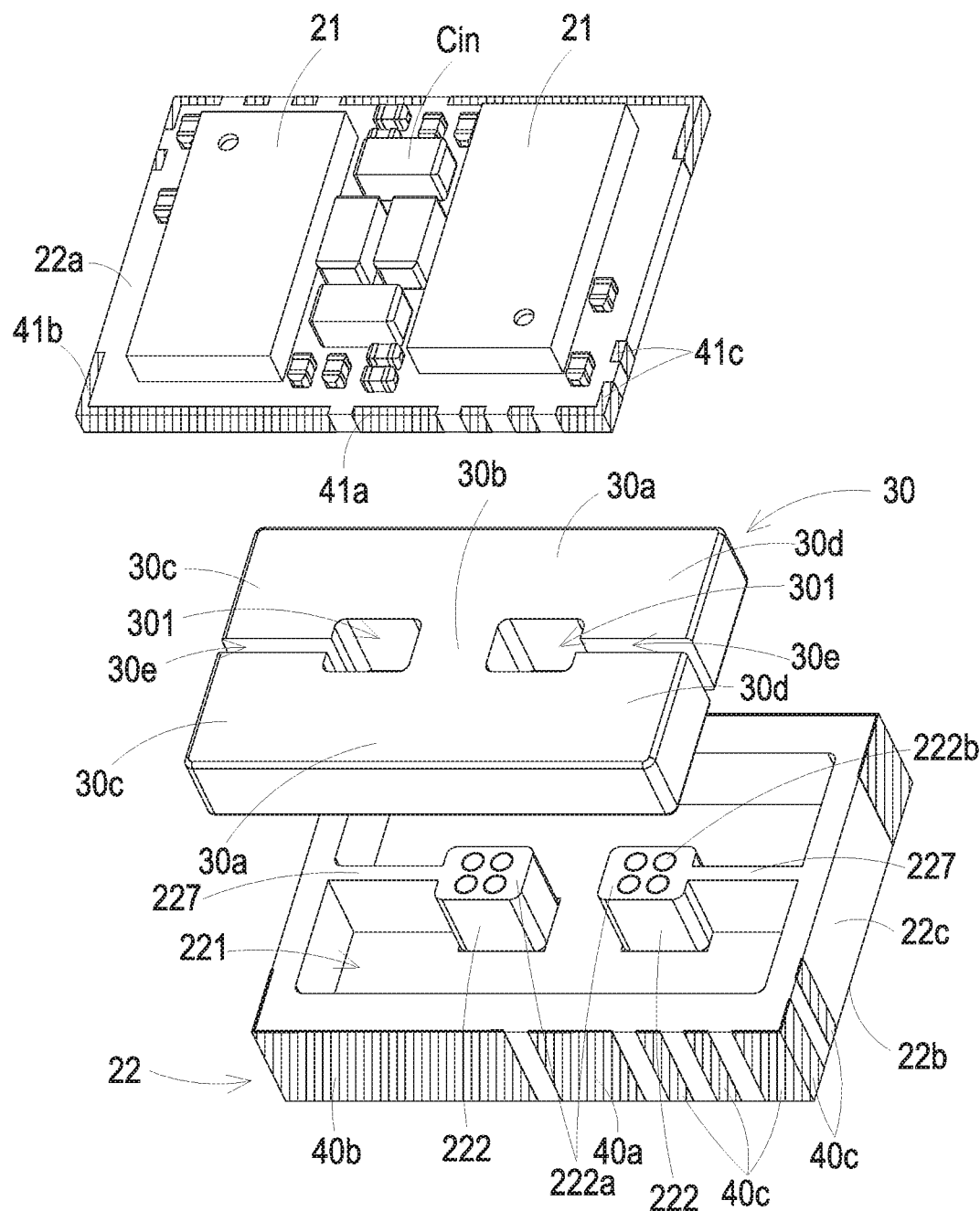
FIG. 5 is a schematic exploded view illustrating the voltage regulator module of FIG. 3.
Figure 6:
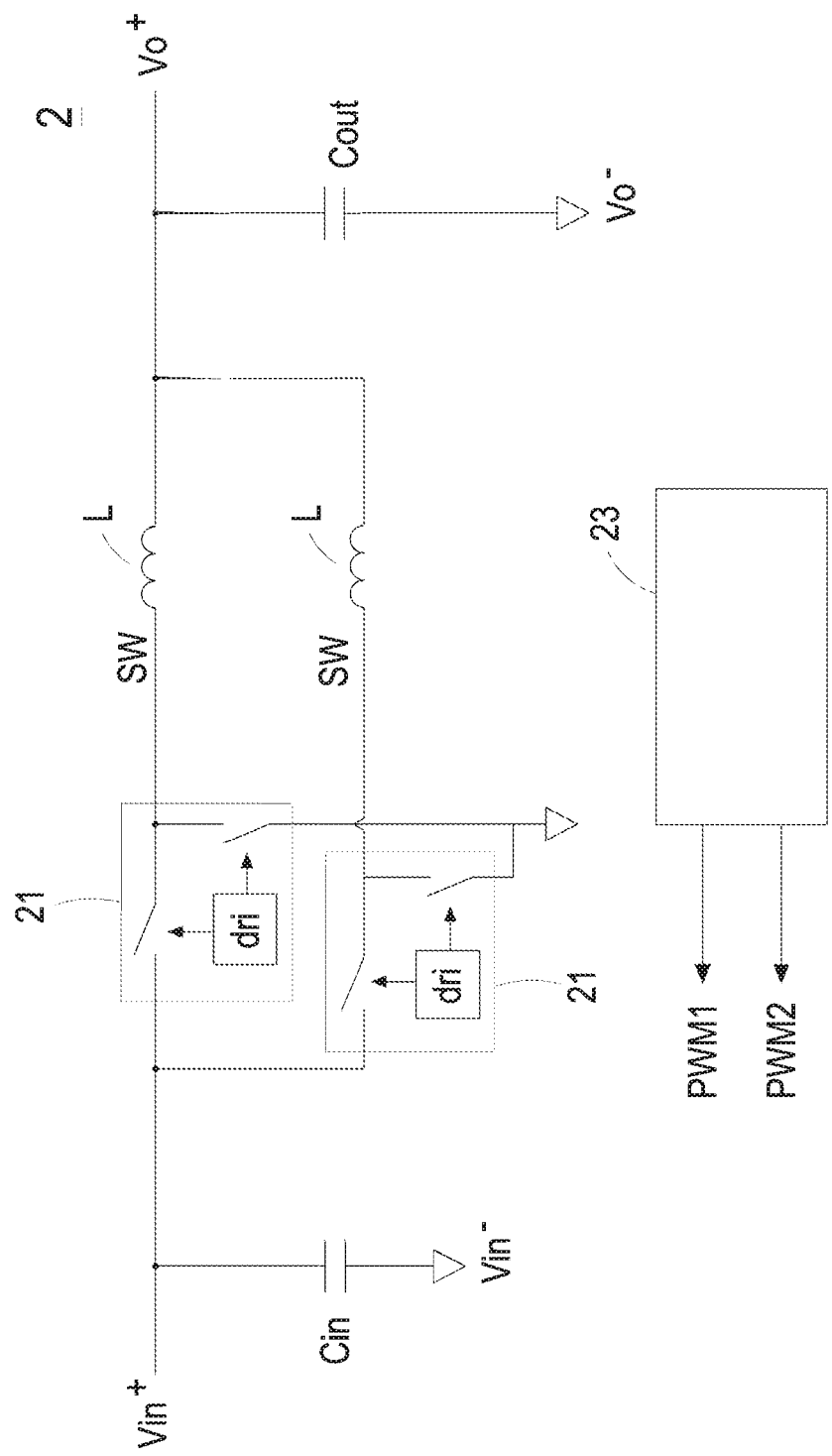
FIG. 6 is a schematic equivalent circuit diagram illustrating the voltage regulator module of FIG. 3.

FIG. 3 is a schematic perspective view illustrating a voltage regulator module according to a first embodiment of the present disclosure and taken along a viewpoint. FIG. 4 is a schematic perspective view illustrating the voltage regulator module of FIG. 3 and taken along another viewpoint. FIG. 5 is a schematic exploded view illustrating the voltage regulator module of FIG. 3. FIG. 6 is a schematic equivalent circuit diagram illustrating the voltage regulator module of FIG. 3. The voltage regulator module 2 may be disposed in an electronic device and welded on a system board (not shown) within the electronic device. The voltage regulator module 2 is at least one phase buck converter and includes at least one switch elements 21, at least one inductor L, at least one input capacitor Cin and at least one output capacitor Cout. For example, the switch element 21 is a driver and metal-oxide-semiconductor field-effect transistor (also referred as a Dr.MOS element 21). In case that the central processing unit of the electronic device requires a large amount of current, the voltage regulator module 2 is a multi-phase buck converter. Consequently, the capability of the voltage regulator module 2 to output electricity is effectively enhanced.

In the embodiment of FIG. 6, the voltage regulator module 2 is a two-phase buck converter. The voltage regulator module 2 includes two switch elements 21 and two inductors L. Each switch element 21 and a first terminal SW of the corresponding inductor L are electrically connected with each other in series to define a phase buck circuit. In this embodiment, the voltage regulator module 2 includes two phase buck circuits. The input side of the voltage regulator module 2 includes a positive input terminal Vin+ and a negative input terminal Vin−. The first terminals of the two phase buck circuits are connected with each other in parallel and electrically connected with the input capacitor Cin. The output side of the voltage regulator module 2 includes a positive output terminal Vo+ and a negative output terminal Vo−. The negative input terminal Vin− and the negative output terminal Vo− are electrically connected with a common terminal. The second terminals of the two phase buck circuits are connected with each other in parallel and electrically connected with the output capacitor Cout. A first terminal of the output capacitor Cout is electrically connected with the positive output terminal Vo+ of the voltage regulator module 2. A second terminal of the output capacitor Cout is electrically connected with the negative output terminal Vo− of the voltage regulator module 2. A first terminal of the input capacitor Cin is electrically connected with the positive input terminal Vin+ of the voltage regulator module 2. A second terminal of the input capacitor Cin is electrically connected with the negative input terminal Vin− of the voltage regulator module 2.

In an embodiment, each switch element 21 includes a switch and a driver for driving the switch. The voltage regulator module 2 further includes a control circuit 23. After the control circuit 23 samples the output voltage of the voltage regulator module 2 and the output current of each phase buck circuit, the control circuit 23 generates two pulse width modulation signals PWM1 and PWM2. The phase difference between the two pulse width modulation signals PWM1 and PWM2 is 0 degree or 180 degree. The first phase buck circuit and the second phase buck circuit are controlled according to the first pulse width modulation signal PWM1 and the second pulse width modulation signal PWM2, respectively.

In this embodiment, the voltage regulator module 2 includes a circuit board assembly 20, at least one electroplated region 40 and a magnetic core assembly 30. The circuit board assembly 20 includes a printed circuit board 22 and at least one switch element 21. The printed circuit board 22 has a first surface 22a, a second surface 22b and a plurality of lateral surfaces 22c. The first surface 22a and the second surface 22b are opposed to each other. The printed circuit board 22 includes an accommodation space 221 and at least one conductive structure 222. All switch elements 21 and all input capacitors Cin are mounted on the first surface 22a of the printed circuit board 22 by a welding process or through a conductive adhesive (see FIG. 3). In addition, all input capacitors Cin are electrically connected with the switch elements 21. In this embodiment, the installation directions of the two switch elements 21 on the first surface 21a of the printed circuit board 22 are opposed. Consequently, the input voltage conduction parts of the two switch elements 21 are arranged near each other. All input capacitors Cin are arranged between the two switch elements 21. Consequently, the input capacitors Cin are shared by the two switch elements 21. Consequently, the nearby input voltage conduction parts of the two switch elements 21 are electrically connected with each other, and the number of the input capacitors Cin is reduced. In some embodiments, the circuit board assembly 20 further includes a filter capacitor (not shown). The filter capacitor is disposed on the first surface 22a of the printed circuit board 22 for driving and powering the switch elements 21.

The plurality of lateral surfaces 22c are connected with each other. Moreover, the plurality of lateral surfaces 22c are circumferentially arranged between the first surface 22a and the second surface 22b. The accommodation space 221 is defined by the first surface 22a, the second surface 22b and the plurality of lateral surfaces 22c collaboratively. The conductive structure 222 is disposed within the accommodation space 221. In an embodiment, the conductive structure 222 is perpendicular to the printed circuit board 22. Alternatively, the conductive structure 222 is not perpendicular to the printed circuit board 22. That is, there is an included angle between the conductive structure 222 and the printed circuit board 22. The conductive structure 222 is arranged between the first surface 22a and the second surface 22b. Consequently, the power current flows along the direction perpendicular to the printed circuit board 22. Preferably but not exclusively, at least one positive output conduction part 223, at least one positive input conduction part 224, at least one negative output conduction part 225 and at least one signal terminal 226 of the voltage regulator module 2 are welded on the second surface 22b of the printed circuit board 22. When the voltage regulator module 2 is connected with the system board, the power is transferred between the voltage regulator module 2 and the system board through the at least one positive output conduction part 223, the at least one positive input conduction part 224 and the at least one negative output conduction part 225. Consequently, the output power and the input power of the voltage regulator module 2 can be transferred to the system board. Moreover, signals can be transferred between the voltage regulator module 2 and the system board through the at least one signal terminal 226. For forming the accommodation space 221, the printed circuit board 22 has a specified thickness (e.g., 3 mm).

The at least one electroplated region 40 is formed on the corresponding lateral surface 22c by an electroplating process. Each electroplated region 40 includes a first positive input electroplated part 40a, a first negative output electroplated part 40b and a plurality of first signal electroplated parts 40c. The first positive input electroplated part 40a is connected between the corresponding positive input conduction part 224 and the first surface 22a of the printed circuit board 22. Consequently, the input power received from the system board can be transferred to the first surface 22a of the printed circuit board 22 through the positive input conduction part 224 and the first positive input electroplated part 40a. The first negative output electroplated part 40b is connected between the corresponding negative output conduction part 225 and the first surface 22a of the printed circuit board 22. Consequently, the input power received from the system board can be transferred to the first surface 22a of the printed circuit board 22 through the negative output conduction part 225 and the first negative output electroplated part 40b. Each first signal electroplated part 40c is connected between the corresponding signal terminal 226 and the first surface 22a of the printed circuit board 22. Consequently, the signal received from the system board can be transferred to the first surface 22a of the printed circuit board 22 through the signal terminal 226 and the first signal electroplated part 40c.

Moreover, the first positive input electroplated part 40a is connected with the corresponding trace pattern of the first surface 22a of the printed circuit board 22. Consequently, the first positive input electroplated part 40a is connected with the positive input pin of the corresponding switch element 21 through the corresponding trace pattern of the first surface 22a. The first negative output electroplated part 40b is connected with the corresponding trace pattern of the first surface 22a of the printed circuit board 22. Consequently, the first negative output electroplated part 40b is connected with the negative output pin of the corresponding switch element 21 through the corresponding trace pattern of the first surface 22a. Each first signal electroplated part 40c is connected with the corresponding trace pattern of the first surface 22a of the printed circuit board 22. Consequently, the first signal electroplated part 40c is connected with the signal pin of the corresponding switch element 21 through the corresponding trace pattern of the first surface 22a.

In another embodiment, the printed circuit board 22 is a multilayered circuit board with an inner layer. The first positive input electroplated part 40a is connected with the corresponding trace pattern of the first surface 22a of the printed circuit board 22 and also connected with the corresponding trace pattern of the inner layer of the printed circuit board 22. The first negative output electroplated part 40b is connected with the corresponding trace pattern of the first surface 22a of the printed circuit board 22 and also connected with the corresponding trace pattern of the inner layer of the printed circuit board 22. The first signal electroplated part 40c is connected with the corresponding trace pattern of the first surface 22a of the printed circuit board 22 and also connected with the corresponding trace pattern of the inner layer of the printed circuit board 22.

The magnetic core assembly 30 is embedded within the accommodation space 221 of the printed circuit board 22. Moreover, the magnetic core assembly 30 includes at least one opening 301 corresponding to the at least one conductive structure 222. When the magnetic core assembly 30 is accommodated within the accommodation space 221 of the printed circuit board 22, the at least one conductive structure 222 is penetrated through the corresponding opening 301. Consequently, an inductor L is defined by the corresponding conductive structure 222 and the magnetic core assembly 30 collaboratively. Since the at least one conductive structure 222 is perpendicular to the printed circuit board 22, the current flows through the at least one conductive structure 222 along the direction perpendicular to the printed circuit board 22. Due to the structural design, the voltage regulator module 2 can be applied to the large current circumstance. When compared with the conventional planar winding structure for flowing the current along the horizontal direction, the current flowing along the direction perpendicular to the printed circuit board 22 can reduce the parasitic resistance of the energy transmission path. Consequently, the power loss of the voltage regulator module 2 is reduced.

The magnetic core assembly 30 includes at least one core unit. In this embodiment, the voltage regulator module 2 is a two-phase buck converter. In other words, the printed circuit board 22 includes two conductive structures 222, and the magnetic core assembly 30 includes two core units. In an embodiment, the core units of the magnetic core assembly 30 are integrally formed as a one-piece structure. Each core unit has the corresponding opening 301. The two conductive structures 222 are penetrated through the corresponding openings 301, respectively. Consequently, two inductors L are defined by the corresponding conductive structures 222 and the corresponding core units collaboratively. Alternatively, the core units are individual components and combined as the magnetic core assembly 30.

As mentioned above, the magnetic core assembly 30 is embedded within the accommodation space 221 of the printed circuit board 22. The conductive structures 222 of the printed circuit board 22 are used as the windings, and the inductors L are defined by the corresponding windings and the magnetic core assembly 30 collaboratively. Consequently, the thickness and the size of the magnetic core assembly 30 are effectively reduced, and the power loss of the inductor winding is reduced. Moreover, since the magnetic core assembly 30 is accommodated within the accommodation space 221 of the printed circuit board 22, the height of the voltage regulator module 2 is substantially equal to the overall height of the printed circuit board 22 and the switch element 21. When compared with the conventional voltage regulator module, the size of the voltage regulator module 2 of the present disclosure can be further reduced.

The voltage regulator module 2 is welded on the system board through the positive output conduction part 223, the positive input conduction part 224, the negative output conduction part 225 and the signal terminal 226 in order to receive the power and the signals from the system board or transmit the power and the signals to the system board. In such way, the voltage regulator module 2 is electrically connected with the system board, the process of designing associated conduction parts is simplified, and the size of the voltage regulator module 2 is reduced. Moreover, the electroplated region 40 is formed on the corresponding lateral surface 22c of the printed circuit board 22 by an electroplating process. Consequently, the positive input terminal, the negative output terminal and the signal terminal of the voltage regulator module 2 are formed. In comparison with the conventional voltage regulator module of using copper blocks as the input terminal and the output terminal, the layout space of the electroplated region 40 is largely reduced. Consequently, the voltage regulator module 2 of the present disclosure can effectively reduce the volume, the parasitic resistance of the energy transmission path and the power loss of the energy transmission path. Since the input terminal and the output terminal of the conventional voltage regulator module are made of copper block, the process of fabricating the electronic device is complicated. Since the formation of the electroplated region 40 is simple, the electronic device with the voltage regulator module 2 of the present disclosure can be produced more simply and quickly. Moreover, since the electroplated region 40 is exposed to the air, the heat dissipating capability of the voltage regulator module 2 is increased and the thermal resistance of the voltage regulator module 2 along the vertical direction is effectively reduced.

In this embodiment, the voltage regulator module 2 is a two-phase buck converter. That is, the voltage regulator module 2 includes two positive output conduction parts 223, two positive input conduction parts 224, two negative output conduction parts 225 and a plurality of signal terminals 226. The two positive output conduction parts 223 are separated from each other and symmetric with respect to a middle region of the second surface 22b of the printed circuit board 22. The second surface 22b of the printed circuit board 22 has four corners. Two corners are arranged along a first diagonal line and symmetric with respect to the midpoint of the second surface 22b of the printed circuit board 22. The other two corners are arranged along a second diagonal line and symmetric with respect to the midpoint of the second surface 22b of the printed circuit board 22. The two negative output conduction parts 225 are located at the two corners along the first diagonal line of the second surface 22b of the printed circuit board 22, and each negative output conduction part 225 is arranged beside the corresponding positive output conduction parts 223, respectively. Moreover, some of the plurality of signal terminals 226 are located at the one corner of the two corners along the second diagonal line and arranged beside the corresponding positive output conduction part 223, and the others of the plurality of signal terminals 226 are located at the other corner of the two corners along the second diagonal line and arranged beside the corresponding positive output conduction part 223. Each positive input conduction part 224 is arranged between the corresponding negative output conduction part 225 and the corresponding signal terminals 226. Each positive input conduction part 224 is arranged beside the corresponding positive output conduction part 223. Since the voltage regulator module 2 is fixed on and electrically connected with the system board through the two positive output conduction parts 223, the two positive input conduction parts 224, the two negative output conduction parts 225 and the plurality of signal terminals 226, the contact areas between associated conduction parts of the voltage regulator module 2 and the system board are increased. Moreover, the current density of the solder joint is effectively reduced, and the capability of the solder joint to withstand weight is enhanced. Consequently, when the voltage regulator module 2 on the system board undergoes a reflow soldering process, the inner components of the voltage regulator module 2 are not detached or shifted. In other words, the reliability of the voltage regulator module 2 is largely enhanced.

In this embodiment, the voltage regulator module 2 includes two electroplated regions 40. Each electroplated region 40 includes a first positive input electroplated part 40a, a first negative output electroplated part 40b and a plurality of first signal electroplated parts 40c. The two first positive input electroplated parts 40a of the two electroplated regions 40 are formed on two opposed lateral surfaces of the plurality of lateral surfaces 22c. The first positive input electroplated part 40a of each electroplated region 40 is connected with the corresponding positive input conduction part 224 through the junction between the lateral surface 22c and the second surface 22b. The first negative output electroplated part 40b of one of the two electroplated regions 40 is located at the two adjacent lateral surfaces 22c. The first negative output electroplated part 40b of the other of the two electroplated region 40 is located at the other two adjacent lateral surfaces 22c. The first negative output electroplated parts 40b are connected with the corresponding negative output conduction parts 225 through the junctions between the corresponding lateral surfaces 22c and the second surface 22b. The plurality of first signal electroplated parts 40c of one of the two electroplated regions 40 are located at the two adjacent lateral surfaces 22c. The plurality of first signal electroplated parts 40c of the other of the two electroplated region 40 are located at the other two adjacent lateral surfaces 22c. The plurality of first signal electroplated parts 40c of each electroplated region 40 are connected with the corresponding signal terminals 226 through the junctions between the corresponding lateral surfaces 22c and the second surface 22b. In another embodiment, the printed circuit board 22 is a multilayered circuit board with multiple inner layers. Each inner layer has a trace pattern. According to the practical requirements, the trace pattern in the inner layer is connected with the electroplated region 40.

Please refer to FIGS. 3, 4 and 5 again. Each electroplated region 40 further includes at least one second positive input electroplated part 41a, at least one second negative output electroplated part 41b and a plurality of second signal electroplated parts 41c. The at least one second positive input electroplated part 41a, the at least one second negative output electroplated part 41b and the plurality of second signal electroplated parts 41c are formed on the first surface 22a of the printed circuit board 22. In this embodiment, as shown in FIGS. 3 and 5, the two electroplated regions 40 include two second positive input electroplated parts 41a, two second negative output electroplated parts 41b and a plurality of second signal electroplated parts 41c. Each second positive input electroplated part 41a is connected with the positive input pin of the corresponding switch element 21 through the corresponding trace pattern of the first surface 22a. Moreover, the second positive input electroplated part 41a is connected with the corresponding first positive input electroplated part 40a through the junction between the corresponding lateral surface 22c and the first surface 22a. Each second negative output electroplated part 41b is connected with the negative output pin of the corresponding switch element 21 through the corresponding trace pattern of the first surface 22a. Moreover, the second negative output electroplated part 41b is connected with the corresponding first negative output electroplated part 40b through the junction between the corresponding lateral surface 22c and the first surface 22a. Each second signal electroplated part 41c is connected with the signal pin of the of the corresponding switch element 21 through the corresponding trace pattern of the first surface 22a. Moreover, the second signal electroplated part 41c is connected with the corresponding first signal electroplated part 40c through the junction between the corresponding lateral surface 22c and the first surface 22a. Consequently, the power can be transferred between the components of the system board and the corresponding switch elements 21 through the positive input conduction parts 224, the negative output conduction parts 225, the first positive input electroplated parts 40a, the second positive input electroplated parts 41a, the first negative output electroplated parts 40b and the second negative output electroplated parts 41b. Moreover, signals can be transferred between the components of the system board and the corresponding switch elements 21 through the signal terminals 226, the negative output conduction parts 225, the first signal electroplated parts 40c, the second signal electroplated parts 41c, the first negative output electroplated parts 40b and the second negative output electroplated parts 41b.

Each conductive structure 222 has a first end 222a and a second end (not shown). The first end 222a and the second end are opposed to each other. The first end 222a of each conductive structure 222 is connected with a SW conduction part (i.e., a conduction part at an end of the inductor) of the corresponding switch element 21 through the corresponding trace pattern of the first surface 22a. The second end (not shown) of each conductive structure 222 is connected with the corresponding positive output conduction part 223 through the corresponding trace pattern of the second surface 22b. Consequently, the output power of the voltage regulator module 2 can be transferred to the system board. In this embodiment, the conductive structure 222 is a portion of the printed circuit board 22, and the conductive structure 222 is protruded out of the accommodation space 221. Each conductive structure 222 includes a plurality of conductive holes 222b. The plurality of conductive holes 222b run through the corresponding conductive structure 222. Since the inner wall of each conductive hole 222b is electroplated with copper, each conductive structure 222 has the electric conduction capacity. In an embodiment, the area of each positive output conduction part 223 is greater than the total area of the plurality of conductive holes 222b in the corresponding conductive structure 222. Moreover, the number of the conductive holes 222b and the diameter of the conductive hole 222b may be varied according to the practical requirements.

In this embodiment, the magnetic core assembly 30 includes two core bodies 30a, a middle leg 30b, two first lateral legs 30c and two second lateral legs 30d. The middle leg 30b is arranged between the middle portions of the two core bodies 30a. The first lateral leg 30c and the second lateral leg 30d are located at two opposite sides of the corresponding core body 30a. One opening 301 is defined by a portion of the two core bodies 30a, the middle leg 30b and the two first lateral legs 30c collaboratively, and the other opening 301 is defined by the other portion of the two core bodies 30a, the middle leg 30b and the two second lateral legs 30d collaboratively. An air gap 30e is formed between the two first lateral legs 30c. Another air gap 30e is formed between the two second lateral legs 30d. Each air gap 30e is in fluid communication with the corresponding opening 301.

In an embodiment, the cross-section area of the middle leg 30b is smaller than a half of the cross-section area of the first lateral leg 30c or a half of the cross-section area of the second lateral leg 30d. In case that the phase difference between the two pulse width modulation signals PWM1 and PWM2 is 0 degree, the DC magnetic fluxes and the AC magnetic fluxes of the middle leg 30b are both balanced out. In another embodiment, the cross-section area of the middle leg 30b is smaller than the cross-section area of the first lateral leg 30c or the cross-section area of the second lateral leg 30d. In case that the phase difference between the two pulse width modulation signals PWM1 and PWM2 is 180 degree, the DC magnetic fluxes of the middle leg 30b are balanced out and the AC magnetic fluxes of the middle leg 30b are superposed.

In an embodiment, the printed circuit board 22 further includes at least one connection structure 227. As shown in FIGS. 3, 4 and 5, the printed circuit board 22 includes two connection structures 227. Each connection structure 227 is connected between the corresponding lateral surface 22c and the corresponding conductive structure 222. Moreover, each connection structure 227 is aligned with the corresponding air gap 30e. When the magnetic core assembly 30 is embedded within the accommodation space 221 of the printed circuit board 22, each connection structure 227 is disposed within the corresponding air gap 30e. It is noted that the length of the air gap 30e, the size and shape of the opening 301, the size and shape of the conductive structure 222 and the size and shape of the connection structure 227 are not restricted. In an embodiment, the connection structure 227 is made of insulation material.

For reducing the parasitic resistance of the conductive structure 222, reducing the power loss and the vertical thermal resistance of the conductive structure 222 and increasing the heat conduction capacity of the voltage regulator module 2 along the vertical direction, the conductive holes 222b of the conductive structure 222 may be modified with metal block.

Figure 7:
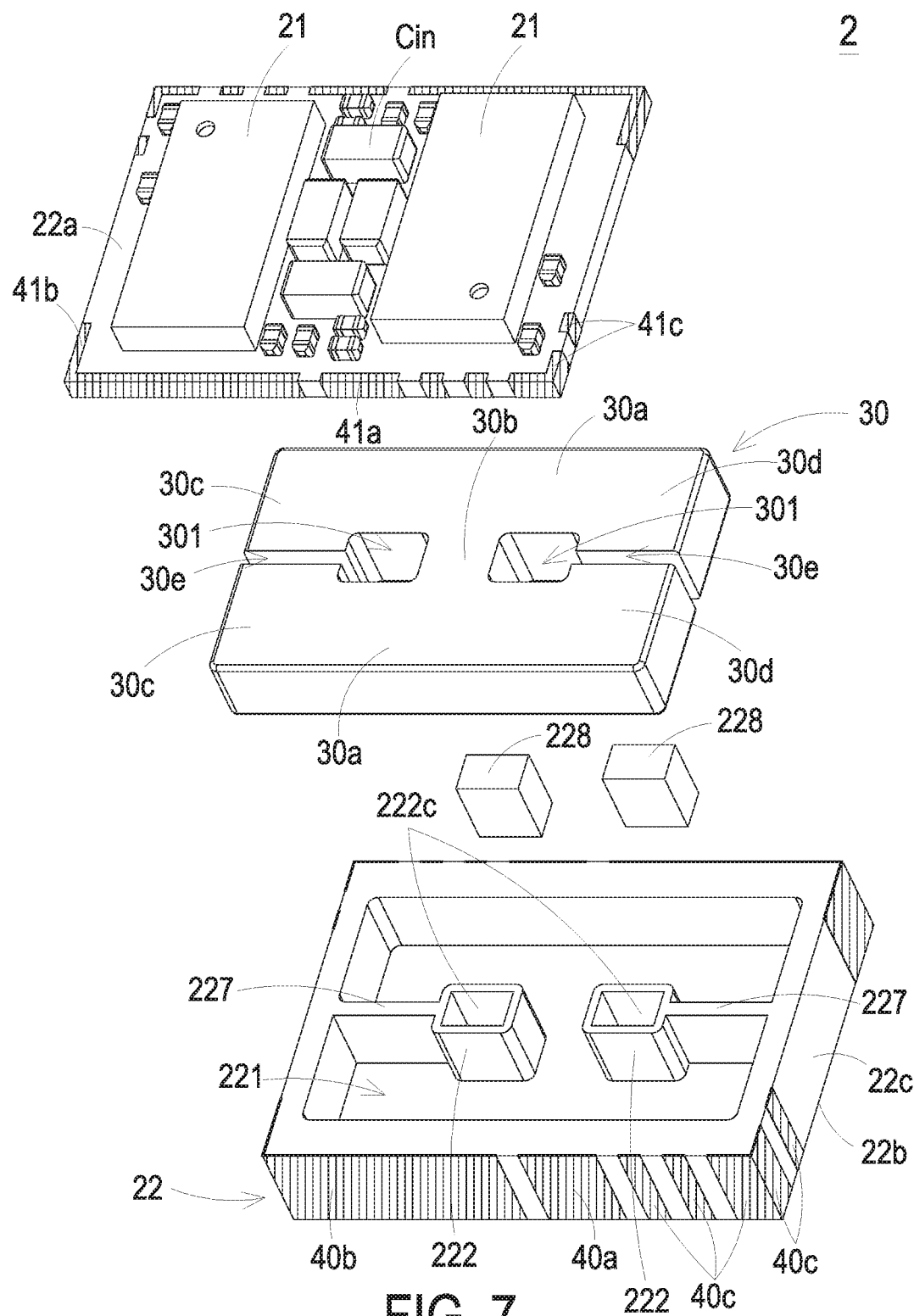
FIG. 7 is a schematic exploded view illustrating a voltage regulator module according to a second embodiment of the present disclosure.

FIG. 7 is a schematic exploded view illustrating a voltage regulator module according to a second embodiment of the present disclosure. In comparison with the first embodiment, the conductive structure 222 of this embodiment does not include a plurality of conductive holes. In this embodiment, the conductive structure 222 includes a single groove 222c. Moreover, the printed circuit board 22 further includes two metal blocks 228. Each metal block 228 is disposed within the groove 222c of the corresponding conductive structure 222. A first end of the metal block 228 is connected with the first end of the corresponding conductive structure 222. Consequently, the first end of each metal block 228 is connected with the corresponding switch element 21 through the first end of the corresponding conductive structure 222. A second end of each metal block 228 is connected with the second end of the corresponding conductive structure 222. Consequently, the second end of the metal block 228 is connected with the corresponding positive output conduction part 223 through the second end of the corresponding conductive structure 222. Moreover, the cross-section area of each positive output conduction part 223 is greater than the cross-section area of the metal block 228 of the conductive structure 222 connected with the positive output conduction part 223. The metal block 228 is made of copper, aluminum, copper alloy, aluminum alloy or any other metal and alloy material with good electrical properties.

From the above descriptions, the present disclosure provides the voltage regulator module. The magnetic core assembly is embedded within the accommodation space of the printed circuit board. The conductive structures of the printed circuit board are used as the windings, and the inductors are defined by the corresponding windings and the magnetic core assembly collaboratively. Consequently, the thickness and the size of the magnetic core assembly are effectively reduced, and the power loss of the inductor winding is reduced. Moreover, since the magnetic core assembly is accommodated within the accommodation space of the printed circuit board, the height of the voltage regulator module is substantially equal to the overall height of the printed circuit board and the switch element. When compared with the conventional voltage regulator module, the size of the voltage regulator module of the present disclosure can be further reduced.

Moreover, the voltage regulator module is disposed on the system board through the positive output conduction part, the positive input conduction part, the negative output conduction part and the signal terminal in order to receive the power and the signals from the system board or transmit the power and the signals to the system board. In such way, the voltage regulator module is electrically connected with the system board, the process of designing associated conduction parts is simplified, and the size of the voltage regulator module is reduced. Moreover, the electroplated region is formed on the corresponding lateral surfaces of the printed circuit board by an electroplating process. Consequently, the positive input terminal, the negative output terminal and the signal terminal of the voltage regulator module are formed. In comparison with the conventional voltage regulator module of using copper blocks as the input terminal and the output terminal, the layout space of the electroplated region is largely reduced. Consequently, the voltage regulator module of the present disclosure can effectively reduce the volume, the parasitic resistance of the energy transmission path and the power loss of the energy transmission path. Since the input terminal and the output terminal of the conventional voltage regulator module are made of copper block, the process of fabricating the electronic device is complicated. Since the formation of the electroplated region is simple, the electronic device with the voltage regulator module of the present disclosure can be produced more simply and quickly. Moreover, since the electroplated region is exposed to the air, the heat dissipating capability of the voltage regulator module is increased and the thermal resistance of the voltage regulator module along the vertical direction is effectively reduced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage regulator module, comprising:
    a circuit board assembly comprising a printed circuit board and at least one switch element, wherein the printed circuit board comprises a first surface, a second surface, a plurality of lateral surfaces, an accommodation space and at least one conductive structure, the plurality of lateral surfaces are circumferentially arranged between the first surface and the second surface, and the accommodation space is defined by the first surface, the second surface and the plurality of lateral surfaces collaboratively, wherein the conductive structure is perpendicular to the printed circuit board and disposed within the accommodation space, the switch element is disposed on the first surface, and at least one conduction part is formed on the second surface;
    at least one electroplated region formed on the corresponding lateral surface, and comprising at least one first electroplated part, wherein the first electroplated part is arranged between the corresponding conduction part and the first surface, and electrically connected with the corresponding conduction part and the at least one switch element; and
    a magnetic core assembly accommodated within the accommodation space and embedded within the printed circuit board, and comprising at least one opening, wherein the at least one conductive structure is penetrated through the corresponding opening, so that at least one inductor is defined by the at least one conductive structure and the magnetic core assembly collaboratively,
    wherein the at least one conduction part comprises at least one positive input conduction part, and the at least one first electroplated part comprises a first positive input electroplated part, wherein the first positive input electroplated part is electrically connected with the corresponding positive input conduction part and a positive input terminal of the corresponding switch element.

2. The voltage regulator module according to claim 1, wherein the at least one conduction part further comprises at least one negative output conduction part, and the at least one first electroplated part further comprises a first negative output electroplated part, wherein the first negative output electroplated part is electrically connected with the corresponding negative output conduction part and a negative output terminal of the corresponding switch element.

3. The voltage regulator module according to claim 2, wherein the at least one conduction part further comprises at least one positive output conduction part.

4. The voltage regulator module according to claim 3, wherein a plurality of signal terminals are formed on the second surface of the printed circuit board, and the at least one first electroplated part further comprises a plurality of first signal electroplated parts, wherein each first signal electroplated part is connected between the corresponding signal terminal and the first surface, and electrically connected with the corresponding signal terminal and a signal pin of the corresponding switch element.

5. The voltage regulator module according to claim 4, wherein the at least one switch element comprises two switch elements, the at least one conductive structure of the printed circuit board comprises two conductive structures, and the at least one opening of the magnetic core assembly comprises two openings, wherein each conductive structure is penetrated through the corresponding opening, and each conductive structure and the magnetic core assembly are collaboratively defined as the corresponding inductor, wherein each switch element and the corresponding inductor are connected with each other in series to form a phase circuit.

6. The voltage regulator module according to claim 5, wherein the at least one positive output conduction part comprises two positive output conduction parts, the at least one positive input conduction part comprises two positive input conduction parts, and the at least one negative output conduction part comprises two negative output conduction parts, wherein the two positive output conduction parts are separated from each other and symmetric with respect to a middle region of the second surface, the two negative output conduction parts are respectively located at two corners of the second surface of the printed circuit board along a first diagonal line, each negative output conduction part is arranged beside the corresponding positive output conduction part, and some of the plurality of signal terminals are located at one of two corners of the second surface of the printed circuit board along a second diagonal line and arranged beside the corresponding positive output conduction part, and the others of the plurality of signal terminals are located at the other of the two corners of the second surface of the printed circuit board along the second diagonal line and arranged beside the corresponding positive output conduction part, wherein each positive input conduction part is arranged between the corresponding negative output conduction part and the corresponding signal terminals, and each positive input conduction part is arranged beside the corresponding positive output conduction part.

7. The voltage regulator module according to claim 5, wherein the at least one electroplated region comprises two electroplated regions, the two first positive input electroplated parts of the two electroplated regions are formed on two opposed lateral surfaces of the plurality of lateral surfaces, wherein the first negative output electroplated part of one of the two electroplated regions is located at two adjacent lateral surfaces of the plurality of lateral surfaces, the first negative output electroplated part of the other of the two electroplated regions is located at other two adjacent lateral surfaces of the plurality of lateral surfaces, wherein some of the plurality of first signal electroplated parts of one of the two electroplated regions are located at two adjacent lateral surfaces of the plurality of lateral surfaces, and the others of the plurality of first signal electroplated parts of the other of the two electroplated regions are located at other two adjacent lateral surfaces of the plurality of lateral surfaces.

8. The voltage regulator module according to claim 4, wherein each electroplated region further comprises at least one second positive input electroplated part, at least one second negative output electroplated part and a plurality of second signal electroplated parts, which are formed on the first surface of the printed circuit board, wherein each second positive input electroplated part is connected with the positive input terminal of the corresponding switch element and the corresponding first positive input electroplated part, each second negative output electroplated part is connected with the negative output terminal of the corresponding switch element and the corresponding first negative output electroplated part, and each second signal electroplated part is connected with the signal pin of the corresponding switch element and the corresponding first signal electroplated part.

9. The voltage regulator module according to claim 3, wherein a first end of each conductive structure is connected with a conduction part of the corresponding switch element through a corresponding trace pattern of the first surface, and a second end of each conductive structure is connected with the corresponding positive output conduction part through a corresponding trace pattern of the second surface.

10. The voltage regulator module according to claim 9, wherein each conductive structure comprises a plurality of conductive holes, wherein each conductive hole runs through the corresponding conductive structure, and an inner wall of each conductive hole is electroplated with copper.

11. The voltage regulator module according to claim 10, wherein an area of each positive output conduction part is larger than a total area of the plurality of conductive holes in the corresponding conductive structure connected with the positive output conduction part.

12. The voltage regulator module according to claim 9, wherein each conductive structure comprises a groove, and the printed circuit board further comprises at least one metal block, wherein each metal block is disposed within the corresponding groove, a first end of each metal block is connected with the first end of the corresponding conductive structure, and a second end of each metal block is connected with the second end of the corresponding conductive structure.

13. The voltage regulator module according to claim 12, wherein a cross-section area of each positive output conduction part is greater than a cross-section area of the corresponding metal block connected with the positive output conduction part.

14. The voltage regulator module according to claim 1, wherein the magnetic core assembly comprises two core bodies, a middle leg, two first lateral legs and two second lateral legs, and the at least one opening comprises two openings, wherein the middle leg is arranged between the middle portions of the two core bodies, and the first lateral leg and the second lateral leg are located at two opposite sides of the corresponding core body, wherein one of the two openings is defined by a portion of the two core bodies, the middle leg and the two first lateral legs collaboratively, and the other of the two openings is defined by the other portion of the two core bodies, the middle leg and the two second lateral legs collaboratively.

15. The voltage regulator module according to claim 14, wherein an air gap is formed between the two first lateral legs, and another air gap is formed between the two second lateral legs, wherein each of the air gaps is in fluid communication with the corresponding opening.

16. The voltage regulator module according to claim 15, wherein the printed circuit board further comprises at least one connection structure, wherein each connection structure is connected between one of the plurality of lateral surfaces and the corresponding conductive structure, wherein when the magnetic core assembly is disposed within the accommodation space of the printed circuit board, each connection structure is disposed within the corresponding air gap.

17. The voltage regulator module according to claim 14, wherein a cross-section area of the middle leg is smaller than a half of a cross-section area of the first lateral leg or a half of a cross-section area of the second lateral leg, or the cross-section area of the middle leg is smaller than the cross-section area of the first lateral leg or the cross-section area of the second lateral leg.

* * * * *